(12) United States Patent
Takamine

(10) Patent No.: US 10,148,250 B2
(45) Date of Patent: Dec. 4, 2018

(54) LADDER FILTER AND DUPLEXER

(71) Applicant: Murata Manufacturing Co., Ltd., Nagaokakyo-shi, Kyoto-fu (JP)

(72) Inventor: Yuichi Takamine, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 27 days.

(21) Appl. No.: 15/401,145

(22) Filed: Jan. 9, 2017

(65) Prior Publication Data

US 2017/0126204 A1 May 4, 2017

Related U.S. Application Data

(63) Continuation of application No. PCT/JP2015/069180, filed on Jul. 2, 2015.

(30) Foreign Application Priority Data

Aug. 26, 2014 (JP) ................................. 2014-171689

(51) Int. Cl.
*H03H 9/64* (2006.01)
*H03H 9/72* (2006.01)

(52) U.S. Cl.
CPC ............ *H03H 9/64* (2013.01); *H03H 9/6483* (2013.01); *H03H 9/725* (2013.01)

(58) Field of Classification Search
CPC ........................................... H03H 9/46–9/725
USPC .................................................. 333/193–196
See application file for complete search history.

(56) References Cited

U.S. PATENT DOCUMENTS

| 5,559,481 | A | 9/1996 | Satoh et al. | |
|---|---|---|---|---|
| 7,515,018 | B2 * | 4/2009 | Handtmann | H03H 9/0095 333/133 |
| 7,548,140 | B2 * | 6/2009 | Jamneala | H03H 9/581 310/357 |
| 8,018,298 | B2 * | 9/2011 | Ueda | H03H 9/562 333/133 |
| 8,125,298 | B2 * | 2/2012 | Hara | H03H 9/0571 333/133 |

(Continued)

FOREIGN PATENT DOCUMENTS

| JP | 05-183380 A | 7/1993 |
|---|---|---|
| JP | 2013-168996 A | 8/2013 |

(Continued)

OTHER PUBLICATIONS

Official Communication issued in corresponding International Application PCT/JP2015/069180, dated Jul. 28, 2015.

*Primary Examiner* — Dean Takaoka
*Assistant Examiner* — Alan Wong
(74) *Attorney, Agent, or Firm* — Keating & Bennett, LLP

(57) ABSTRACT

A ladder filter that sufficiently attenuates a signal in a frequency range in a vicinity of a pass band on a lower-frequency side of the pass band includes a plurality of series arm resonators and at least three parallel arm resonators provided in at least three respective parallel arms. One of the at least three parallel arm resonators farthest from an input terminal and an output terminal, is subjected to parallel division to include a first division resonator and a second division resonator. The second division resonator has the highest resonant frequency and the smallest electrostatic capacitance of all of the parallel arm resonators and the division resonators.

20 Claims, 4 Drawing Sheets

(56) References Cited

U.S. PATENT DOCUMENTS

| | | | |
|---|---|---|---|
| 9,467,117 B2 * | 10/2016 | Fujiwara | H03H 9/6483 |
| 9,722,575 B2 * | 8/2017 | Taniguchi | H03H 9/132 |
| 2007/0247259 A1 | 10/2007 | Takata | |
| 2012/0032753 A1 | 2/2012 | Nishimura et al. | |
| 2014/0218129 A1 | 8/2014 | Fujiwara et al. | |
| 2014/0266510 A1 * | 9/2014 | Silver | H03H 9/465 |
| | | | 333/186 |
| 2015/0214923 A1 * | 7/2015 | Tsuzuki | H03H 9/568 |
| | | | 343/850 |
| 2018/0013405 A1 * | 1/2018 | Takata | H03H 9/6483 |

FOREIGN PATENT DOCUMENTS

| | | |
|---|---|---|
| WO | 2006/067935 A1 | 6/2006 |
| WO | 2013/080461 A1 | 6/2013 |

\* cited by examiner

LADDER FILTER AND DUPLEXER

CROSS REFERENCE TO RELATED APPLICATIONS

This application claims the benefit of priority to Japanese Patent Application No. 2014-171689 filed on Aug. 26, 2014, and is a Continuation Application of PCT Application No. PCT/JP2015/069180 filed on Jul. 2, 2015. The entire contents of each application are hereby incorporated herein by reference.

BACKGROUND OF THE INVENTION

1. Field of the Invention

The present invention relates to a ladder filter including a plurality of series arm resonators and a plurality of parallel arm resonators and a duplexer.

2. Description of the Related Art

In recent years, ladder filters have been widely used as band-pass filters in cellular phones. Japanese Unexamined Patent Application Publication No. 5-183380 discloses a ladder filter including a series arm resonator and a parallel arm resonator which are surface acoustic wave resonators.

For example, duplexers for use in Band 13 are currently required to increase the amount of attenuation in a public safety band that is outside of a transmission band of Band 13 on a lower-frequency side by 2 MHz.

It is difficult for ladder filters in the related art to sufficiently attenuate a signal in a vicinity of a pass band on a lower-frequency side of the pass band.

SUMMARY OF THE INVENTION

Preferred embodiments of the present invention provide a ladder filter capable of sufficiently attenuating a signal in a frequency range in a vicinity of a pass band on a lower-frequency side of the pass band.

A ladder filter according to a preferred embodiment of the present invention includes a plurality of series arm resonators provided in a series arm that connects an input terminal and an output terminal and at least three parallel arm resonators provided in at least three respective parallel arms that connect the series arm and a ground potential. One of the at least three parallel arm resonators, which is farthest from the input terminal and the output terminal, is subjected to parallel division to include a first division resonator and a second division resonator. The second division resonator has a highest resonant frequency and a smallest electrostatic capacitance of all of the parallel arm resonators and the division resonators.

A ladder filter according to a preferred embodiment of the present invention filter further includes a piezoelectric substrate and a plurality of interdigital transducer (IDT) electrodes provided on the piezoelectric substrate. The series arm resonators and the parallel arm resonators are defined by the IDT electrodes.

In a ladder filter according to a preferred embodiment of the present invention, n that is a number of the parallel arms is an odd number and the parallel arm resonator provided in a middle one of the parallel arms is subjected to parallel division.

In still another ladder filter according to a preferred embodiment of the present invention, n that is a number of the parallel arms is an even number and the parallel arm resonator provided in at least one of an n/2nd one and an {(n/2)+1}th one of the parallel arms as viewed from the input terminal is subjected to parallel division.

A duplexer according to a preferred embodiment of the present invention includes a transmission filter and a receiving filter. The transmission filter includes a ladder filter according to a preferred embodiment of the present invention.

A ladder filter according to a preferred embodiment of the present invention is able to sufficiently attenuate a signal in a frequency range in a vicinity of a pass band on a lower-frequency side of the pass band.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described in detail below with reference to the accompanying drawings.

Figure 1:
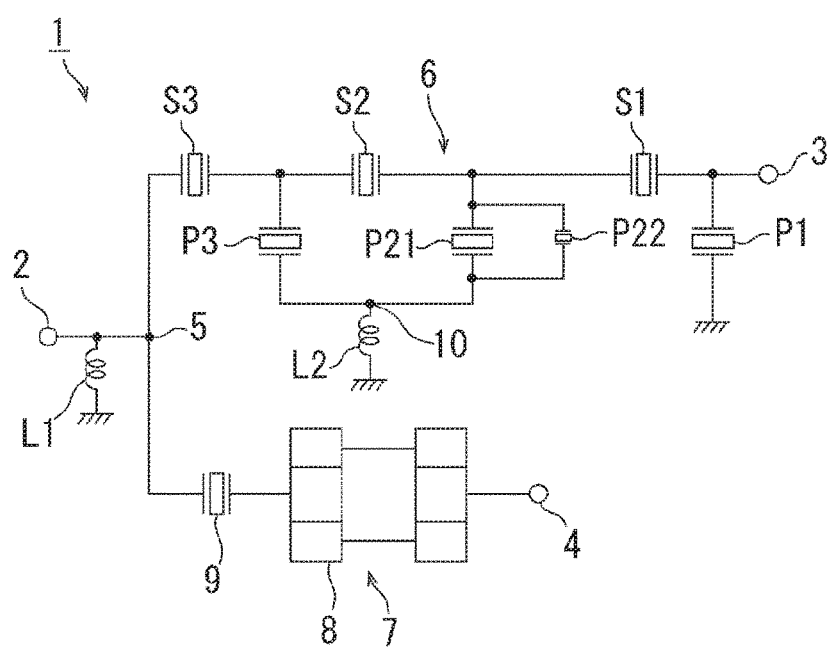
FIG. 1 is a circuit diagram of a duplexer including a ladder filter according to a first preferred embodiment of the present invention.

FIG. 1 is a circuit diagram of a duplexer including a ladder filter according to a first preferred embodiment of the present invention.

A duplexer 1 is preferably used for the transmission/reception of a signal in Band 13, for example. In Band 13, a transmission band is about 777 MHz to about 787 MHz. The sufficient attenuation of a signal is currently needed in a public safety band of 768 MHz to 775 MHz.

The duplexer 1 includes an antenna terminal 2, a transmission terminal 3, and a receiving terminal 4. A common connection terminal 5 is connected to the antenna terminal 2. An inductance L1 is connected between the common connection terminal 5 and a ground potential. A transmission filter 6 is connected between the common connection terminal 5 and the transmission terminal 3. The transmission filter 6 is a ladder filter according to a first preferred embodiment of the present invention. The transmission terminal 3 defines and functions as an input terminal, and the common connection terminal 5 defines and functions as an output terminal.

A receiving filter 7 is connected between the common connection terminal 5 and the receiving terminal 4. The receiving filter 7 includes a longitudinally coupled resonator-type surface acoustic wave filter 8 and a surface acoustic wave resonator 9 connected to the input side of the longitudinally coupled resonator-type surface acoustic wave filter 8.

The transmission filter 6 includes a plurality of series-arm resonators S1 to S3 arranged in a series arm. Specifically, in the transmission filter 6, the first series arm resonator S1 to the third series arm resonator S3 are arranged in this order from the side of the transmission terminal 3 defining and functioning as an input terminal.

A first parallel arm to a third parallel arm that connect the series arm and the ground potential are provided. The first parallel arm, the second parallel arm, and the third parallel arm are arranged in this order from the side of the transmission terminal 3 defining and functioning as an input terminal. In the first parallel arm, a first parallel arm resonator P1 is provided. In the second parallel arm, a first division resonator P21 and a second division resonator P22 are provided. In the third parallel arm, a third parallel arm resonator P3 is provided. The second parallel arm resonator is subjected to parallel division to include the first division resonator P21 and the second division resonator P22 as described above. The first division resonator P21 and the second division resonator P22 are connected in parallel.

The second parallel arm and the third parallel arm are connected to each other at a common node 10. Between the ground potential and the common node 10, an inductance L2 is connected.

All of the first series arm resonator S1 to the third series arm resonator S3, the first parallel arm resonator P1, the third parallel arm resonator P3, the first division resonator P21, and the second division resonator P22 are surface acoustic wave resonators.

Figure 2A:
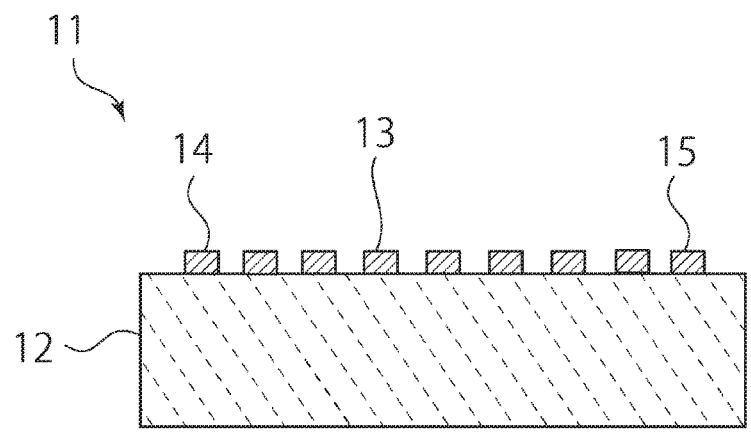
FIG. 2A is a schematic elevational cross-sectional view illustrating a surface acoustic wave resonator and FIG. 2B is a schematic plan view illustrating an electrode structure.
Figure 2B:
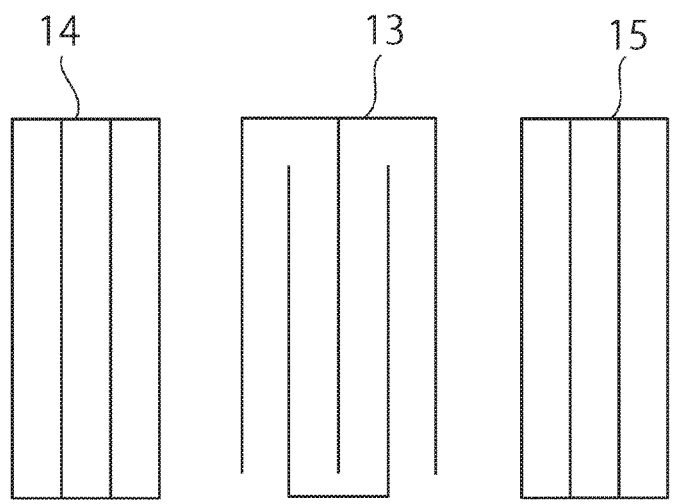

FIG. 2A is a schematic elevational cross-sectional view illustrating the structure of a surface acoustic wave resonator. FIG. 2B is a schematic plan view illustrating the electrode structure of the surface acoustic wave resonator. In the surface acoustic wave resonator 11, an interdigital transducer (IDT) electrode 13 and reflectors 14 and 15 are provided on a piezoelectric substrate 12. Specifically, a one-port surface acoustic wave resonator is provided on the piezoelectric substrate 12.

All of the first series arm resonator S1 to the third series arm resonator S3, the first parallel arm resonator P1, the third parallel arm resonator P3, the first division resonator P21, and the second division resonator P22 preferably have this structure of a surface acoustic wave resonator. In reality, the transmission filter 6 includes, on a single piezoelectric substrate, a plurality of surface acoustic wave resonators that are connected via a wiring pattern.

One of the unique features of the first preferred embodiment is that 1) the second parallel arm resonator is subjected to parallel division to include the first division resonator P21 and the second division resonator P22, 2) the second division resonator P22 has the highest resonant frequency of the resonators provided in all of the parallel arms, and 3) the second division resonator P22 has the smallest electrostatic capacitance of the resonators provided in all of the parallel arms. As a result, the amount of attenuation is very large in a frequency range in the vicinity of a pass band on a lower-frequency side of the pass band. In addition, degradation in loss rarely occurs. This will be described on the basis of specific examples of experiments.

Figure 3:
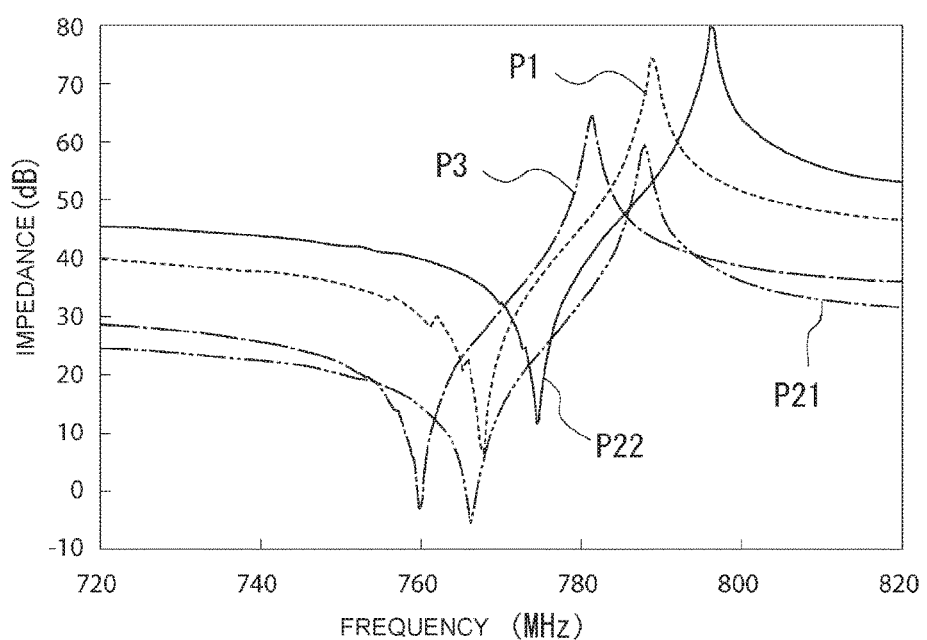
FIG. 3 is a diagram illustrating the impedance-frequency characteristics of a first parallel arm resonator, a first division resonator, a second division resonator, and a third parallel arm resonator.

FIG. 3 is a diagram illustrating the impedance-frequency characteristics of the first parallel arm resonator P1, the first division resonator P21, the second division resonator P22, and the third parallel arm resonator P3. A broken line indicates the impedance-frequency characteristics of the first parallel arm resonator P1, a chain double-dashed line indicates the impedance-frequency characteristics of the first division resonator P21, a solid line indicates the impedance-frequency characteristics of the second division resonator P22, and alternate long and short dashed lines indicate the impedance-frequency characteristics of the third parallel arm resonator P3.

As is apparent from FIG. 3, in this preferred embodiment, the second division resonator P22 has the highest resonant frequency of these resonators provided in the parallel arms. More specifically, the resonant frequency is located around 770 MHz, for example. Accordingly, in this preferred embodiment, the transmission filter 6 is able to achieve a large amount of attenuation in this frequency range.

The design parameters of respective resonators in the transmission filter 6 that is a ladder filter according to this preferred embodiment are indicated by the following table 1.

TABLE 1

| Resonator | IDT Wavelength [μm] | Intersecting Width [μm] | Number of Pairs of Electrode Fingers |
|---|---|---|---|
| P1  | 4.883 | 47.5  | 76  |
| S1  | 4.799 | 33.4  | 92  |
| P21 | 4.959 | 125.2 | 111 |
| P22 | 4.853 | 34    | 60  |
| S2  | 4.779 | 30.9  | 95  |
| P3  | 4.902 | 182.7 | 99  |
| S3  | 4.783 | 30.1  | 70  |

As a comparative example, a ladder filter that has the same configuration as a ladder filter according to the above-described preferred embodiment except that a second parallel arm resonator was not subjected to parallel division was created. The design parameters of resonators in this ladder filter that is a comparative example are indicated by the following table 2.

TABLE 2

| Resonator | IDT Wavelength [μm] | Intersecting Width [μm] | Number of Pairs of Electrode Fingers |
|---|---|---|---|
| P1 | 4.959 | 122   | 77  |
| S1 | 4.666 | 30.2  | 68  |
| P2 | 4.92  | 86.2  | 72  |
| S2 | 4.59  | 30.7  | 75  |
| P3 | 5.011 | 127.1 | 149 |
| S3 | 4.784 | 49.6  | 110 |

In a ladder filter according to the above-described preferred embodiment and a ladder filter that is a comparative example, 42° Y-cut X-propagation LiTaO$_3$ substrates are used as piezoelectric substrates, for example. An IDT electrode and a reflector have a film thickness that is about 8% of the wavelength of a propagating elastic wave and are made of Al, for example.

Figure 4:
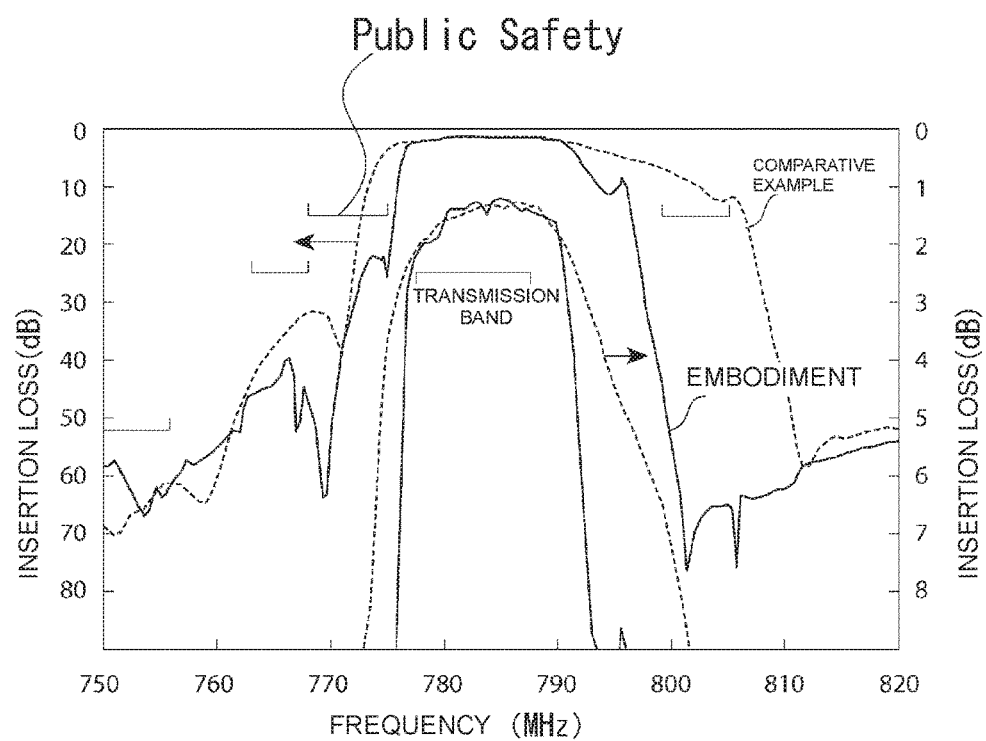
FIG. 4 is a diagram illustrating attenuation frequency characteristics of a ladder filter according to the first preferred embodiment of the present invention and a ladder filter that is a comparative example.

FIG. 4 illustrates the attenuation frequency characteristics of a ladder filter according to the first preferred embodiment and a ladder filter that is a comparative example having the above-described configurations. Referring to FIG. 4, a solid line indicates a result of the first preferred embodiment and a broken line indicates a result of the comparative example.

As is apparent from FIG. 4, according to this preferred embodiment, it is possible to achieve a very large amount of attenuation in frequency ranges in the vicinity of a pass band on both of the lower-frequency side and the higher-frequency side of the pass band.

The duplexer 1 is preferably used for the transmission/reception of a signal in Band 13, for example. In Band 13, a transmission band is 777 to 787 MHz. The sufficient attenuation of a signal is currently needed in a public safety band of 768 MHz to 775 MHz.

As is apparent from FIG. 4, according to this preferred embodiment, the amount of attenuation becomes very large in the above-described public safety band. In contrast, an insertion loss in the pass band is the same or substantially the same as that in the comparative example and the amount of attenuation in a receiving band (746 MHz to 756 MHz) is sufficiently large. The reason for this will be described below.

In order to increase the amount of attenuation in a frequency range in the vicinity of a pass band on the lower-frequency side of the pass band, it is necessary to increase the resonant frequency of any one of parallel arm resonators. In a case where the resonant frequency of a parallel arm resonator near a transmission terminal and an antenna terminal is increased, the impedance of the transmission terminal and the antenna terminal is deteriorated. This leads to degradation in insertion loss in the pass band.

In this preferred embodiment, the second division resonator P22 in the second parallel arm resonator farthest from the input terminal and the output terminal has the highest resonant frequency. Degradation in insertion loss in the pass band therefore rarely occurs.

On the other hand, in a case where the electrostatic capacitance of a parallel arm resonator having a high resonant frequency is increased, an insertion loss in a pass band becomes large. In this preferred embodiment, the second division resonator P22 having a high resonant frequency has the smallest electrostatic capacitance of the resonators provided in the parallel arms. Also from this viewpoint, degradation in insertion loss in the pass band therefore rarely occurs.

The first division resonator P21 is connected in parallel to the second division resonator P22. This contributes to the suppression of reduction in the amount of attenuation in a frequency range apart from a pass band, for example, in a receiving band.

As described above, according to this preferred embodiment, the amount of attenuation is able to be sufficiently large in a frequency range in the vicinity of a pass band on the lower-frequency side of the pass band. In addition, degradation in insertion loss in the pass band rarely occurs, and the reduction in the amount of attenuation in a frequency range outside of the pass band also rarely occurs.

A ladder filter according to a preferred embodiment of the present invention includes the first to third parallel arms, but may include three or more parallel arms. In a case where n that is a number of parallel arms is an odd number, a parallel arm resonator provided in a parallel arm that is the middle of a plurality of parallel arms may be subjected to parallel division like in the above-described preferred embodiment.

On the other hand, in a case where n that is the number of parallel arms is an even number, a parallel arm resonator provided in at least one of the n/2nd parallel arm and the {(n/2)+1}th parallel arm as viewed from the input terminal may be subjected to parallel division.

In the above-described preferred embodiment, various preferred embodiments of the present invention preferably are applied to a transmission filter for use in Band 13, for example. Various preferred embodiments of the present invention can also be used for applications other than a transmission filter for use in Band 13. Specifically, a ladder filter according to a preferred embodiment of the present invention can be applied to band pass filters having various pass bands.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A ladder filter comprising:
a plurality of series arm resonators provided in a series arm that connects an input terminal and an output terminal; and
at least three parallel arm resonators provided in at least three respective parallel arms that connect the series arm and a ground potential; wherein
one of the at least three parallel arm resonators, which is farthest from the input terminal and the output terminal, is subjected to parallel division to include a first division resonator and a second division resonator;
the second division resonator has a highest resonant frequency and a smallest electrostatic capacitance of all of the parallel arm resonators and the division resonators; and
a wavelength of the second division resonator is longer than a wavelength of any of the plurality of series arm resonators.

2. The ladder filter according to claim 1, further comprising:
a piezoelectric substrate; and
a plurality of interdigital transducer (IDT) electrodes provided on the piezoelectric substrate; wherein
the series arm resonators and the parallel arm resonators are defined by the IDT electrodes.

3. The ladder filter according to claim 1, wherein
n that is a number of the parallel arms is an odd number; and
the parallel arm resonator provided in a middle one of the parallel arms is subjected to parallel division.

4. The ladder filter according to claim 1, wherein
n that is a number of the parallel arms is an even number; and
the parallel arm resonator provided in at least one of an n/2nd one and an {(n/2)+1}th one of the parallel arms as viewed from the input terminal is subjected to parallel division.

5. The ladder filter according to claim 1, wherein
the first division resonator and the second division resonator are connected in parallel.

6. The ladder filter according to claim 1, wherein between two of the at least three parallel arms are connected to each other at a common node, and an inductance is connected between the ground potential and the common node.

7. The ladder filter according to claim 1, wherein all of the plurality of series arm resonators, two of the at least three parallel arm resonators, the first division resonator, and the second division resonator are surface acoustic wave resonators.

8. The ladder filter according to claim 1, wherein all of the plurality of series arm resonators, two of the at least three parallel arm resonators, the first division resonator, and the second division resonator have a same structure.

9. The ladder filter according to claim 1, wherein the ladder filter defines a transmission filter including a plurality of surface acoustic wave resonators that are connected via a wiring pattern and provided on a single piezoelectric substrate.

10. A duplexer comprising:
a transmission filter including the ladder filter according to claim 1; and
a receiving filter.

11. The duplexer according to claim 10, wherein the ladder filter further comprises:
a piezoelectric substrate; and
a plurality of interdigital transducer (IDT) electrodes provided on the piezoelectric substrate; wherein
the series arm resonators and the parallel arm resonators are defined by the IDT electrodes.

12. The duplexer according to claim 10, wherein
n that is a number of the parallel arms is an odd number; and
the parallel arm resonator provided in a middle one of the parallel arms is subjected to parallel division.

13. The duplexer according to claim 10, wherein
n that is a number of the parallel arms is an even number; and
the parallel arm resonator provided in at least one of an n/2nd one and an {(n/2)+1}th one of the parallel arms as viewed from the input terminal is subjected to parallel division.

14. The duplexer according to claim 10, wherein the duplexer is transmits/receives a signal in Band 13.

15. The duplexer according to claim 10, wherein the duplexer has a transmission band is about 777 MHz to about 787 MHz.

16. The duplexer according to claim 10, wherein the receiving filter includes a longitudinally coupled resonator-type surface acoustic wave filter and a surface acoustic wave resonator 9 connected to an input side of the longitudinally coupled resonator-type surface acoustic wave filter.

17. The duplexer according to claim 10, wherein
the first division resonator and the second division resonator are connected in parallel.

18. The duplexer according to claim 10, wherein between two of the at least three parallel arms are connected to each other at a common node, and an inductance is connected between the ground potential and the common node.

19. The duplexer according to claim 10, wherein all of the plurality of series arm resonators, two of the at least three parallel arm resonators, the first division resonator, and the second division resonator are surface acoustic wave resonators.

20. The duplexer according to claim 10, wherein all of the plurality of series arm resonators, two of the at least three parallel arm resonators, the first division resonator, and the second division resonator have a same structure.

* * * * *